(12) United States Patent
Wu et al.

(10) Patent No.: US 12,196,491 B2
(45) Date of Patent: *Jan. 14, 2025

(54) ADAPTIVE BAKING METHOD

(71) Applicant: TAIWAN SEMICONDUCTOR MANUFACTURING COMPANY, LTD., Hsinchu (TW)

(72) Inventors: Tzung-Chen Wu, Hsinchu (TW); Heng-Jen Lee, Hsinchu (TW); Ho-Yung David Hwang, Hsinchu (TW); Wen-Zhan Zhou, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 382 days.

This patent is subject to a terminal disclaimer.

(21) Appl. No.: 17/527,991

(22) Filed: Nov. 16, 2021

(65) Prior Publication Data

US 2022/0074668 A1    Mar. 10, 2022

Related U.S. Application Data

(60) Continuation of application No. 16/017,791, filed on Jun. 25, 2018, now Pat. No. 11,204,200, which is a
(Continued)

(51) Int. Cl.
| | |
|---|---|
| *F27D 19/00* | (2006.01) |
| *F27B 17/00* | (2006.01) |
| *H01L 21/67* | (2006.01) |
| *G03F 7/16* | (2006.01) |

(52) U.S. Cl.
CPC .......... *F27D 19/00* (2013.01); *F27B 17/0025* (2013.01); *H01L 21/67103* (2013.01);
(Continued)

(58) Field of Classification Search
CPC ................. F27B 17/0025; F27D 19/00; F27D 2019/0003; F27D 2019/0034;
(Continued)

(56) References Cited

U.S. PATENT DOCUMENTS

| 6,207,937 B1 | 3/2001 | Stoddard et al. | |
| 6,462,313 B1 * | 10/2002 | Sandhu | ............ H01L 21/67248 |
| | | | 392/416 |

(Continued)

FOREIGN PATENT DOCUMENTS

| TW | 200534063 | 10/2005 |
| TW | 200540937 | 12/2005 |

(Continued)

*Primary Examiner* — Steven B McAllister
*Assistant Examiner* — Benjamin W Johnson
(74) *Attorney, Agent, or Firm* — Hauptman Ham, LLP

(57) ABSTRACT

A controller includes a non-transitory computer readable medium configured to store information related to a target temperature of a wafer, a target temperature of a heating element, a temperature of the wafer, and a temperature of the heating element. The controller further includes a processor connected to the non-transitory computer readable medium, the processor configured to generate at least one heating signal during a baking process to adjust a duration of an entirety of the baking process in response to the temperature of the wafer and the temperature of the heating element.

20 Claims, 5 Drawing Sheets

Related U.S. Application Data division of application No. 14/200,214, filed on Mar. 7, 2014, now Pat. No. 10,006,717.

(52) U.S. Cl.
CPC .. *H01L 21/67248* (2013.01); *H01L 21/67288* (2013.01); *F27D 2019/0003* (2013.01); *F27D 2019/0034* (2013.01); *F27D 2019/0037* (2013.01); *G03F 7/168* (2013.01)

(58) Field of Classification Search
CPC ............. F27D 2019/0037; G03F 7/168; H01L 21/67103; H01L 21/67248; H01L 21/67288
USPC .......................................................... 432/18
See application file for complete search history.

(56) References Cited

U.S. PATENT DOCUMENTS

| | | | |
|---|---|---|---|
| 7,534,627 B2 | 5/2009 | Michaelson et al. | |
| 8,547,521 B1 | 10/2013 | Dakshina-Murthy et al. | |
| 2004/0250762 A1 | 12/2004 | Shigetomi et al. | |
| 2005/0115945 A1 | 6/2005 | Kesteren et al. | |
| 2007/0235134 A1 | 10/2007 | Limuro | |
| 2008/0064128 A1 | 3/2008 | Ishigaki | |
| 2009/0060480 A1* | 3/2009 | Herchen | F27B 17/0025 219/390 |
| 2009/0114158 A1 | 5/2009 | Zucker et al. | |
| 2009/0215201 A1* | 8/2009 | Benjamin | H01L 21/68714 438/5 |
| 2010/0111511 A1* | 5/2010 | Merry | H01L 21/67115 219/385 |
| 2011/0061810 A1 | 3/2011 | Ganguly et al. | |
| 2011/0083837 A1* | 4/2011 | Sasaki | H01L 21/67248 165/104.14 |

FOREIGN PATENT DOCUMENTS

| | | |
|---|---|---|
| TW | I278726 | 4/2007 |
| TW | 200807613 | 2/2008 |
| TW | 2008032583 | 8/2008 |
| TW | 201005868 | 2/2010 |
| TW | I334986 | 12/2010 |

\* cited by examiner

ADAPTIVE BAKING METHOD

PRIORITY CLAIM

The present application is a continuation of U.S. application Ser. No. 16/017,791, filed Jun. 25, 2018, which is a divisional of U.S. application Ser. No. 14/200,214, filed Mar. 7, 2014, now U.S. Pat. No. 10,006,717, issued Jun. 26, 2018, which are incorporated herein by reference in their entireties.

BACKGROUND

Wafer baking is used to help cure a photoresist material on a wafer prior to patterning the photoresist material. The wafer is placed in a baking chamber and heated using a heating element. A duration and temperature of the baking process are pre-determined based a material of the photoresist material and characteristics of the wafer. The temperature in the baking chamber is kept at a constant temperature during the baking process. Following the baking process, the photoresist is patterned.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
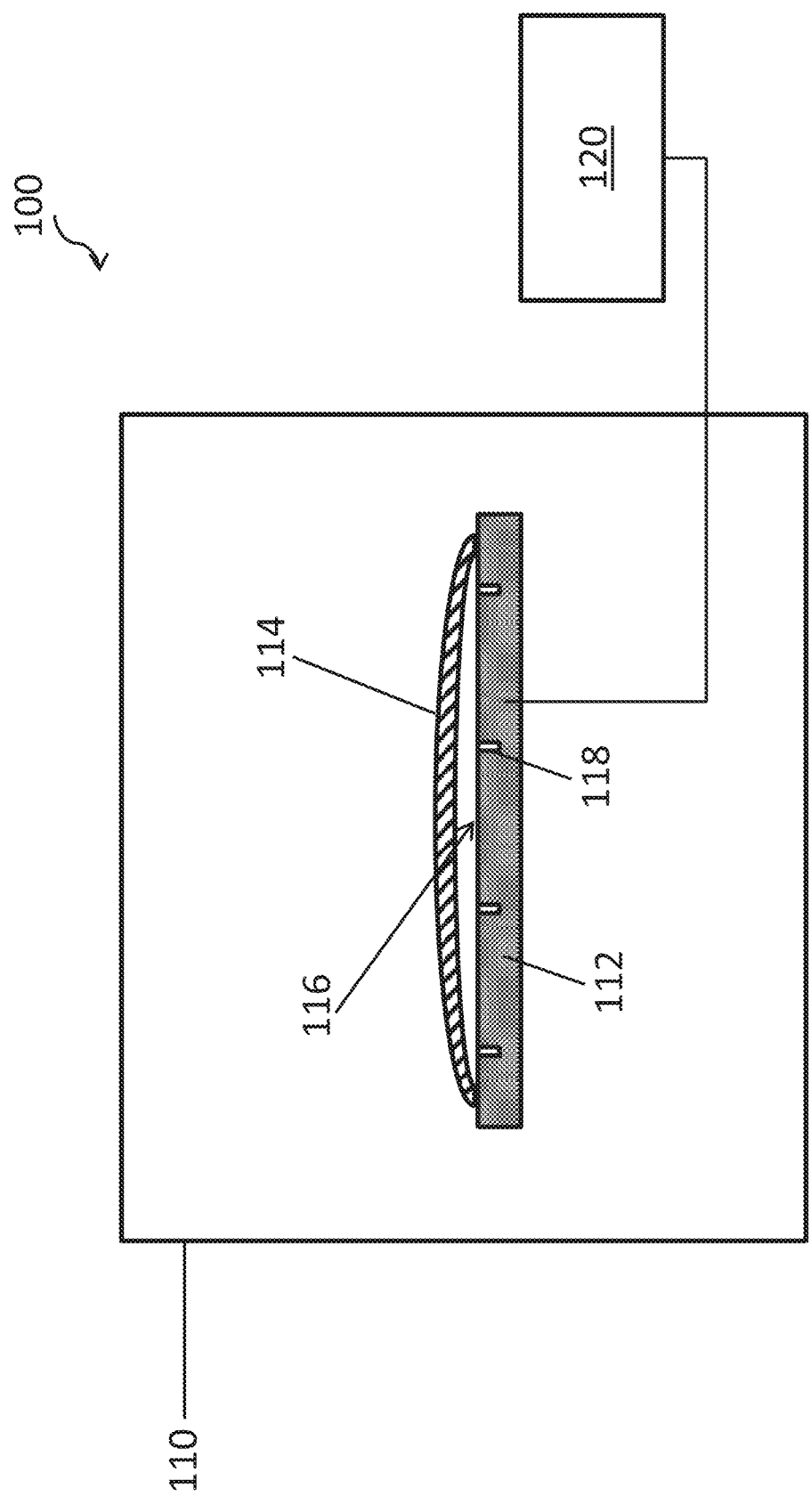
FIG. 1 is a schematic diagram of an adaptive baking system in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic diagram of an adaptive baking system 100 in accordance with some embodiments. Adaptive baking system 100 includes a chamber 110. A heating element 112 is positioned within chamber 110 and configured to support a wafer 114. Wafer 114 has a curvature which results from warpage induced by prior processing steps performed on the wafer. A gap 116 exists between wafer 114 and heating element 112 due to the warpage. During operation, heating element 112 is configured to generate heat in order to bake wafer 114. A controller 120 is configured to provide signals to heating element 112 to control an amount of heat provided to wafer 114. Adaptive baking system 100 further includes sensors 118 embedded in a surface of heating element 112.

Chamber 110 is configured to house wafer 114 on heating element 112. Chamber 110 includes a port for inserting and removing wafer 114 from an interior of the chamber. In some embodiments, chamber 110 includes an insulating covering configured to reduce heat loss from walls of the chamber to a surrounding environment. In some embodiments, walls of chamber 110 include steel, aluminum, ceramic or other suitable material. In some embodiments, chamber 110 is sufficiently large to house multiple heating elements 112.

Heating element 112 is configured to support wafer 114 and supply heat to the wafer during the baking process. Heating element 112 is configured to receive signals from controller 120 and change an amount or a location of heat provided to wafer 114 during the baking process. In some embodiments, heating element 112 includes sensors configured to measure a temperature at a surface of the heating element closest to wafer 114. In some embodiments, the sensors include thermometers, thermocouples, or other suitable temperature measuring elements. In some embodiments, heating element 112 includes a resistive heater. In some embodiments, heating element 112 includes at least one channel for transporting a heating fluid through the heating element. In some embodiments, heating element 112 includes an infrared light source configured to emit infrared radiation to contact wafer 114.

Figure 2:
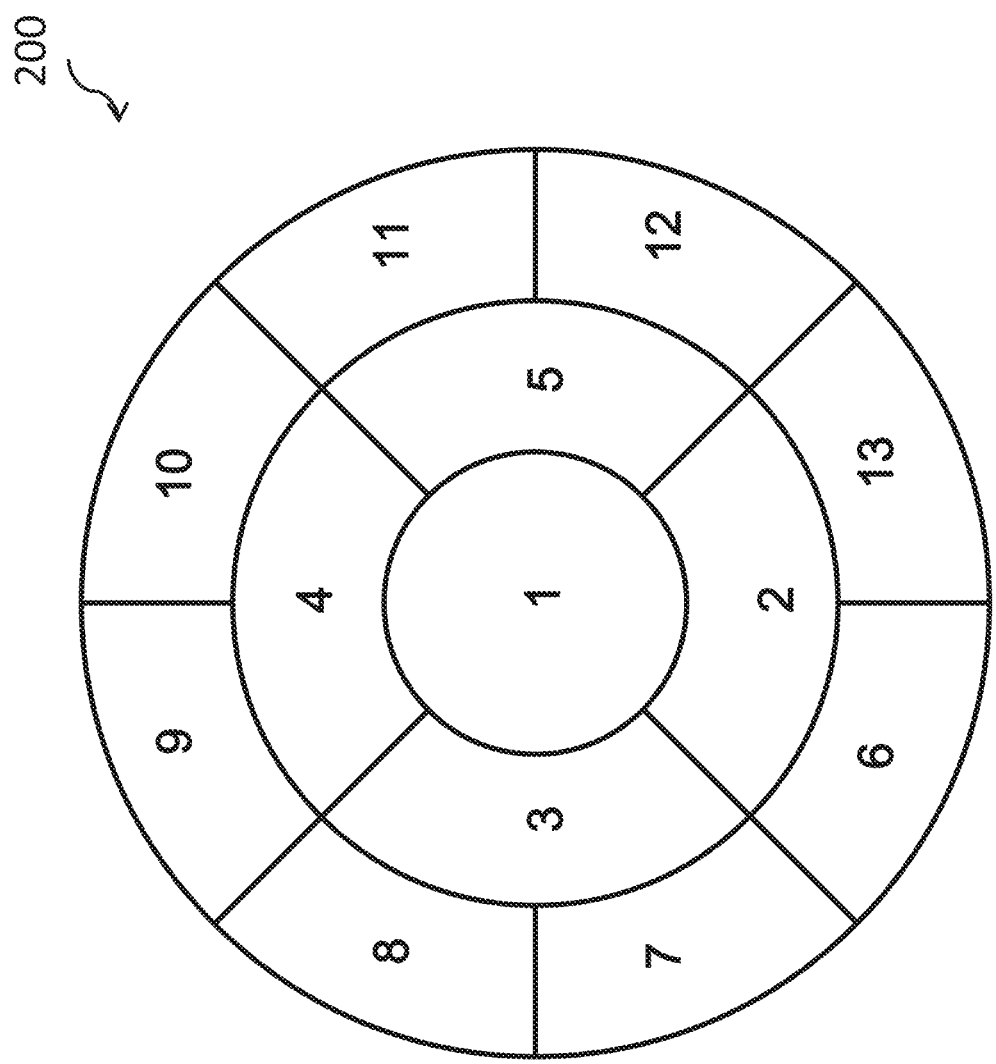
FIG. 2 is a top view of a heating element in accordance with some embodiments.

FIG. 2 is a top view of a heating element 200 in accordance with some embodiments. Heating element 200 includes thirteen heating zones 1-13. In some embodiments, the heating element includes from 2 to 100 zones or from 5 to 30 zones. In some embodiments, the heating element as from 1 to 5 heating zones per 50-80 $cm^2$ of the heating element surface. In some embodiments, heating element 200 includes more or less than thirteen heating zones. In some embodiments, the heating zones are arranged in a concentric pattern. In some embodiments, the heating zones are arranged in a radial pattern. In some embodiments, the heating zones are arranged in a linear pattern or any other suitable arrangement. In some embodiments, the heating zones are individually controllable to adjust an amount and a duration of heating provided to a wafer, e.g., wafer 114 (FIG. 1).

In some embodiments where heating element 200 includes resistive heating elements, at least one separate heating element is included in each heating zone. In some embodiments where heating element 200 includes a channel for transporting a heating fluid, each heating zone includes a flow controlling element configure to enable increased or decreased flow of the heating fluid through the channel in the respective heating zone. In some embodiments, the flow controlling element includes a diverter, a valve, or another suitable flow controlling element. In some embodiments where heating element 200 includes an infrared light source, each heating zone includes radiation blocking element configured to selectively enable propagation of the infrared radiation through the heating element. In some embodiments, the radiation blocking element includes a shutter, a liquid crystal element, an electro-chromic element or another suitable radiation blocking element.

Returning to FIG. 1, during operation wafer 114 is housed in chamber 110 and supported on heating element 112. In some embodiments, wafer 114 includes active elements. In some embodiments, wafer 114 includes a photoresist layer over a surface thereof. In some embodiments, the baking process is used to cure the photoresist layer over wafer 114.

In some embodiments, chamber 110 includes sensors configured to measure a temperature of at least one surface of the wafer 114. In some embodiments, the sensors are configured to connect to wafer 114 prior to insertion into chamber 110. In some embodiments, the sensors are configured to connect to wafer 114 following insertion into chamber 110. In some embodiments, the sensors, e.g., sensors 118, are embedded in a surface of heating element 112. In some embodiments, the sensors are remote sensors configured to measure a temperature of wafer 114 without contacting the wafer. In some embodiments, the sensors include thermometers, thermocouples, or other suitable temperature measuring elements.

Gap 116 is between wafer 114 and heating element 112. In some embodiments, where wafer 114 experiences little or no warpage during prior processing gap 116 is reduced or omitted. Gap 116 changes an ability of heating element 112 to transfer heat to wafer 114 by changing a medium through which the heat energy is transferred. Edges of wafer 114 are in direct contact with heating element 112 while gap 116 has a greatest thickness near a center portion of the wafer. Based on this arrangement, the edges of wafer 114 will receive a higher amount of heat energy in comparison with the center portion of the wafer if heating element 112 is configured to provide uniform heating across an entire surface of the heating element.

Controller 120 is configured to control an amount of heat energy provided by heating element 112. In some embodiments, controller 120 is configured to receive temperature information from wafer temperature sensors. In some embodiments, controller 120 is configured to receive temperature information from heating element temperature sensors. In some embodiments, controller 120 is configured to individually control heating zones of heating element 112.

In some embodiments where controller 120 is configured to individually control heating zones, the controller is configured to send a single heating signal to heating element 112. Heating element 112 then addresses the signal to the heating zones based on address information in the signal. In some embodiments where controller 120 is configured to individually control heating zones, the controller is configured to send a separate signal to each heating zone of heating element 112. In some embodiments, controller 120 is configured to control individual heating zones in based on an amount of heat provided in adjacent heating zones. For example, control for heating zone 3 of heating element 200 (FIG. 2) is controlled based on an amount of heat provided in adjacent heating zones 1, 2, 4, 7 and 8.

Figure 3:
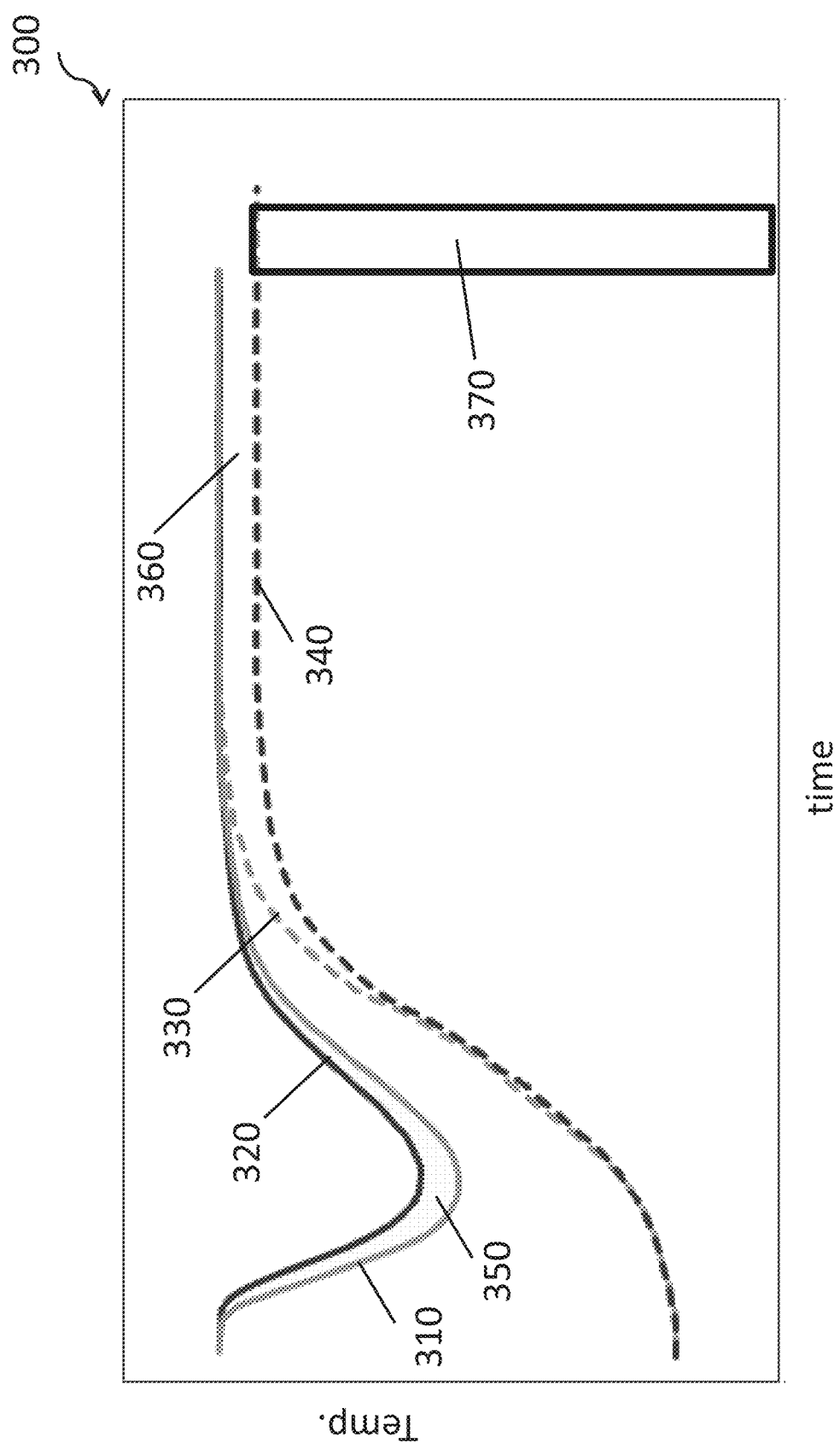
FIG. 3 is a graph of a temperature of a wafer and a heating element during a baking process in accordance with some embodiments.

In some embodiments, controller 120 is configured to control heating element 112 based on a graph of a temperature of heating element 112 and of a temperature of wafer 114. FIG. 3 is a graph 300 of a temperature of a wafer and a heating element during a baking process in accordance with some embodiments. Graph 300 includes a plot 310 of a target heating element temperature and a plot 320 of a measured heating element temperature. Graph 300 further includes a plot 330 of a target wafer temperature and a plot 340 of a measured wafer temperature. A largest heating element temperature variation 350 exists between plot 310 and plot 320. A largest wafer temperature variation 360 exists between plot 330 and plot 340. A compensation heating duration 370 is used to modify a baking process to obtain satisfactory results for a wafer, e.g., wafer 114 (FIG. 1).

In some embodiments, a controller, e.g., controller 120 (FIG. 1) is configured to control compensation heating duration 370. In some embodiments, as an area between plot 310 and plot 320 or an area between plot 330 and plot 340 increases, the controller is configured to increase compensation heating duration 370. In some embodiments, as largest heating element temperature variation 350 or largest wafer temperature variation 360 increases, the controller is configured to increase compensation heating duration 370. In some embodiments, as a magnitude of a slope of plot 310 increases, the controller is configured to decrease compensation heating duration 370. The controller is configured to adjust a size of compensation heating duration 370 by sending signals to a heating element, e.g., heating element 112. In some embodiments, the controller is configured to adjust an amount of heat provided by the heating element uniformly across the heating element. In some embodiments, the controller is configured to adjust an amount of heat provided by the heating element based on individually heating zone on the heating element.

Figure 4:
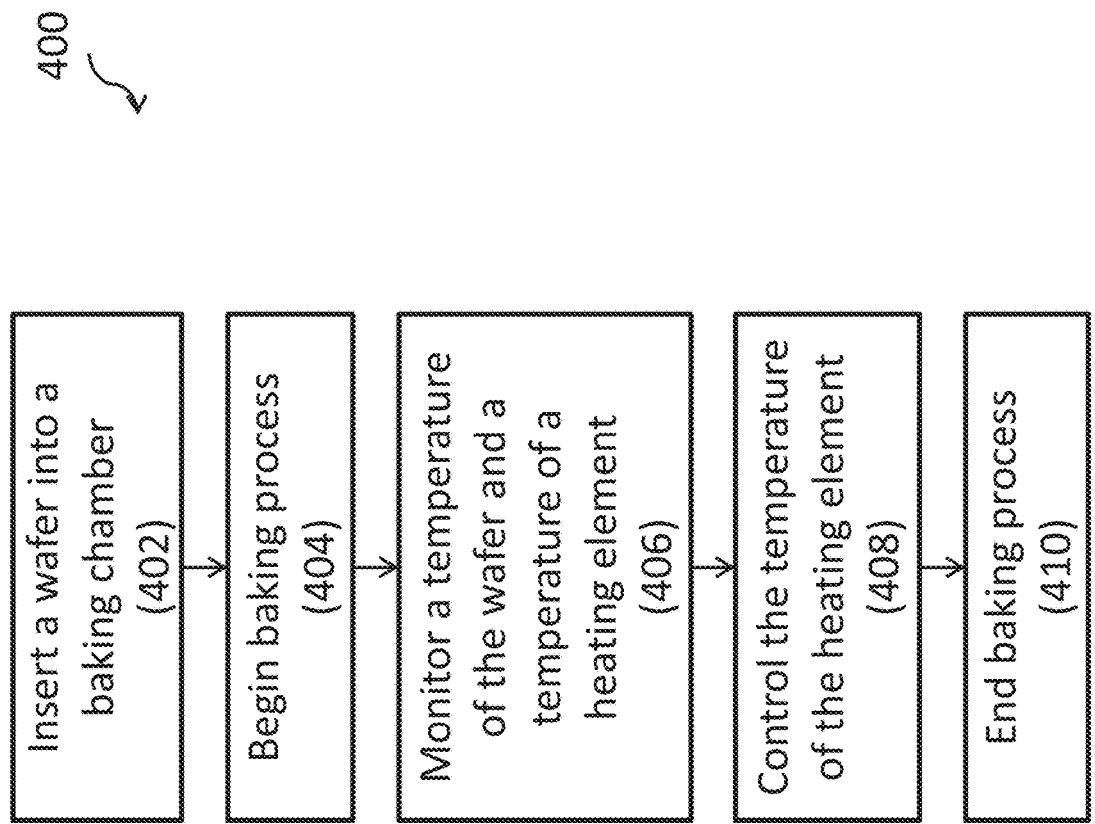
FIG. 4 is a flow chart of a method of using an adaptive baking system in accordance with some embodiments.

FIG. 4 is a flow chart of a method 400 of using an adaptive baking system in accordance with some embodiments. Method 400 begins with operation 402 in which a wafer is inserted into a baking chamber. The wafer is positioned on a heating element, e.g., heating element 112 (FIG. 1), in the baking chamber. In some embodiments, the wafer, e.g., wafer 114, is inserted through a port in an outer wall of the baking chamber, e.g., chamber 110. In some embodiments, the wafer is inserted using a robotic arm. In some embodiments, the wafer is stored in a front opening universal pod (FOUP) prior to insertion in to the baking chamber. In some embodiments, the port is configured to close following insertion of the wafer. In some embodiments, multiple wafers are positioned on a single heating element. In some embodiments, the baking chamber includes multiple heating elements and a single wafer is placed on each heating element.

Method 400 continues with operation 404 in which a baking process begins. In some embodiments, the baking process is used to cure a photoresist layer on the wafer. In some embodiments, the baking process begins by using a controller, e.g., controller 120 (FIG. 1), to provide a signal to the heating element. Heating element begins providing heat to the wafer in response to the signal from the controller. In some embodiments, an additional heating element is used to provide a portion of the heat provided to the wafer. In some embodiments, the additional heating element comprises a radiative heating element, a heating gas inserted into the baking chamber, a heating lamp or another suitable heating element. In some embodiments, a temperature of the baking process is determined based on a curing temperature of a layer on the wafer. In some embodiments, the temperature of the baking process is based on empirical data collected from previous baking processes.

In operation 406, a temperature of the wafer and a temperature of the heating element are monitored. In some embodiments, the temperature of the wafer is monitored using a plurality of sensors positioned across a surface of the wafer. In some embodiments, the temperature of the wafer is monitored using a remote temperature sensing element. In some embodiments, the sensors are connected to the wafer prior to operation 402. In some embodiments, the sensors are connected to the wafer following operation 402. In some embodiments, the sensors are embedded in a surface of the heating element. In some embodiments, the sensors include thermometers, thermocouples, or other suitable temperature measuring elements.

In some embodiments, the temperature of the heating element is monitored using a plurality of sensors positioned across a surface of the heating element. In some embodiments, the temperature of the heating element is monitored using a remote temperature sensing element. In some embodiments, the sensors are embedded in a surface of the heating element. In some embodiments, the sensors include thermometers, thermocouples, or other suitable temperature measuring elements. In some embodiments, the sensors on the wafer are located to correspond to a position of the sensors on the heating element. In some embodiments, the sensors on the wafer are located at positions which do not correspond to a position of the sensors on the heating element.

The temperature information related to the wafer and the heating element is provided to a controller. In some embodiments, the controller is configured to directly receive the temperature information. In some embodiments, the controller is configured to receive the temperature information from a relay or decoding element electrically between the sensors of at least one of the wafer or the heating element and the controller.

Method 400 continues with operation 408 in which a temperature of the heating element is controlled. The controller receives the temperature information, determines whether a temperature of the wafer or the heating element is different from a target temperature and generates instructions for adjusting the temperature of the heating element based on this determination. In some embodiments, the controller extends a time of the baking process based on the determined temperature variation.

In some embodiments, the controller individually controls heating zones of the heating element. In some embodiments, the controller sends a single heating signal to the heating element, the heating signal is then addressed to a specific heating zone by the heating element. In some embodiments the controller sends a separate signal to each heating zone of the heating element. In some embodiments, the controller controls individual heating zones in based on an amount of heat provided in adjacent heating zones. For example, control for heating zone 1 of heating element 200 (FIG. 2) is controlled based on an amount of heat provided in adjacent heating zones 2-5.

In operation 410, the baking process ends and the wafer is removed from the baking chamber. In some embodiments, the wafer is removed through a port in an outer wall of the baking chamber. In some embodiments, the wafer is removed through a same port through which the wafer is inserted in operation 402. In some embodiments, the wafer is removed through a different port from the port through which the wafer is inserted in operation 402. In some embodiments, the wafer is removed using a robotic arm. In some embodiments, the wafer is stored in a FOUP following removal from the baking chamber. In some embodiments, the port is configured to close following removal of the wafer.

Figure 5:
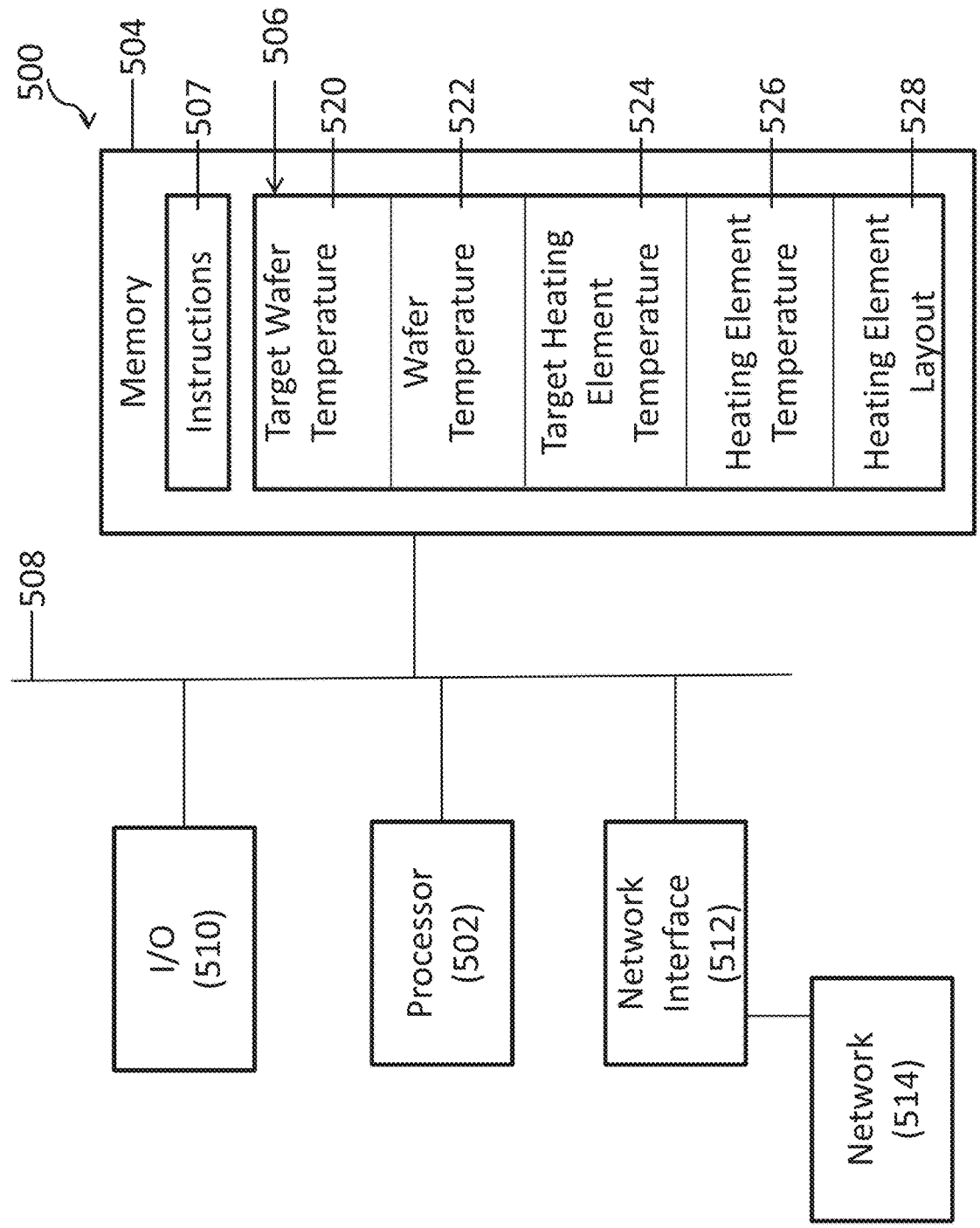
FIG. 5 is a block diagram of a general purpose computer system for implementing instructions for using an adaptive baking system in accordance with one or more embodiments.

FIG. 5 is a block diagram of a general purpose computer system 500 for implementing instructions for using an adaptive baking system in accordance with one or more embodiments System 500 includes a hardware processor 502 and a non-transitory, computer readable storage medium 504 encoded with, i.e., storing, the computer program code 506, i.e., a set of executable instructions. Computer readable storage medium 504 is also encoded with instructions 507 for interfacing with manufacturing machines for producing the memory array. The processor 502 is electrically coupled to the computer readable storage medium 504 via a bus 508. The processor 502 is also electrically coupled to an I/O interface 510 by bus 508. A network interface 512 is also electrically connected to the processor 502 via bus 508. Network interface 512 is connected to a network 514, so that processor 502 and computer readable storage medium 504 are capable of connecting to external elements via network 514. The processor 502 is configured to execute the computer program code 506 encoded in the computer readable storage medium 504 in order to cause system 500 to be usable for performing a portion or all of the operations as described in method 400.

In some embodiments, the processor 502 is a central processing unit (CPU), a multi-processor, a distributed processing system, an application specific integrated circuit (ASIC), and/or a suitable processing unit.

In some embodiments, the computer readable storage medium 504 is an electronic, magnetic, optical, electromagnetic, infrared, and/or a semiconductor system (or apparatus or device). For example, the computer readable storage medium 504 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 504 includes a compact disk-read only memory (CD-ROM), a compact disk-read/write (CD-R/W), and/or a digital video disc (DVD).

In some embodiments, the storage medium 504 stores the computer program code 506 configured to cause system 500 to perform method 400. In some embodiments, the storage medium 504 also stores information needed for performing a method 400 as well as information generated during performing the method 400, such as a target wafer temperature parameter 520, a wafer temperature parameter 522, a target heating element temperature parameter 524, a heating element temperature parameter, a heating element layout parameter and/or a set of executable instructions to perform the operation of method 400.

In some embodiments, the storage medium 504 stores instructions 507 for interfacing with manufacturing machines. The instructions 507 enable processor 502 to generate manufacturing instructions readable by the manufacturing machines to effectively implement method 400 during a manufacturing process.

System 500 includes I/O interface 510. I/O interface 510 is coupled to external circuitry. In some embodiments, I/O interface 510 includes a keyboard, keypad, mouse, trackball, trackpad, and/or cursor direction keys for communicating information and commands to processor 502.

System 500 also includes network interface 512 coupled to the processor 502. Network interface 512 allows system 500 to communicate with network 514, to which one or more other computer systems are connected. Network interface 512 includes wireless network interfaces such as BLUETOOTH, WIFI, WIMAX, GPRS, or WCDMA; or wired network interface such as ETHERNET, USB, or IEEE-1394. In some embodiments, method 400 is implemented in two or more systems 500, and information such as wafer temperature, heating element temperature and heating element layout are exchanged between different systems 500 via network 514.

System 500 is configured to receive information related to a target wafer temperature through I/O interface 510 or network interface 512. The information is transferred to processor 502 via bus 508, the information is then stored in computer readable medium 504 as target wafer temperature parameter 520. System 500 is configured to receive information related to wafer temperature through I/O interface 510 or network interface 512. The information is stored in computer readable medium 504 as wafer temperature parameter 522. System 500 is configured to receive information related to the target heating element temperature through I/O interface 510 or network interface. The information is stored in computer readable medium 504 as target heating element temperature 524. System 500 is configured to receive information related to heating element temperature through I/O interface 510 or through network interface 512. The information is stored in computer readable medium 504 as heating element temperature parameter 526. System 500 is configured to receive information related to heating element layout through I/O interface 510 or network interface 512. The information is stored in computer readable medium 504 as heating element layout parameter 528.

During operation, processor 502 executes a set of instructions to determine a difference between the target wafer temperature and the wafer temperature as well as between the target heating element temperature and the heating element temperature. Processor 502 is configured to use this difference to determine whether to adjust an amount heat being provided by the heating element. Processor 502 is configured to use the heating element layout parameter 528 to determine which heating zone(s) to increase or decrease an amount of heat provided. In some embodiments, processor 502 is configured to extend an amount of time of a baking process based on the determined temperature variation. In some embodiments, processor 502 is configured to increase an amount of heat provided by the heating element as a temperature variation between the target wafer temperature and the wafer temperature or between the target heating element temperature and the heating element temperature increases. In some embodiments, processor 502 is configured to increase an amount of heat provided by the heating element as a largest heating element temperature variation between the target wafer temperature and the wafer temperature or between the target heating element and the heating element temperature increases. In some embodiments, processor 502 is configured to decrease an amount of heat provided by the heating element as a rate of change of the temperature of the heating element versus time increases.

An aspect of this description relates to a controller includes a non-transitory computer readable medium configured to store information related to a target temperature of a wafer, a target temperature of a heating element, a temperature of the wafer, and a temperature of the heating element. The controller further includes a processor connected to the non-transitory computer readable medium, the processor configured to generate at least one heating signal during a baking process to adjust a duration of an entirety of the baking process in response to the temperature of the wafer and the temperature of the heating element. In some embodiments, the processor is further configured to generate a plurality of heating signals, wherein each heating signal of the plurality of heating signals corresponds to a heating zone of a plurality of heating zones of the heating element. In some embodiments, the processor is configured to generate the at least one heating signal for a first heating zone of the heating element based on an amount of heat provided by a plurality of heating zones of the heating element adjacent to the first heating zone.

An aspect of this description relates to a method. The method includes performing a baking process on a wafer, wherein the baking process comprises heating the wafer for a first duration using a heating element. The method further includes measuring a temperature of the heating element and a temperature of the wafer during the first duration to obtain temperature information related to both the heating element and the wafer. The method further includes decreasing, during the first duration, an amount of heat provided by the heating element as a rate of change of the temperature information versus time increases. In some embodiments, performing the baking process includes individually controlling each of a plurality of heating zones the heating element. In some embodiments, performing the baking process includes controlling a resistive heater of the heating element. In some embodiments, performing the baking process includes controlling a fluid flowing through the heating element. In some embodiments, performing the backing process includes controlling an infrared light source. In some embodiments, the method further includes increasing a duration of the baking process beyond the first duration in response to the temperature in response to the temperature information being below a target temperature information. In some embodiments, increasing the duration of the baking process includes determining the duration based on a target heating rate of the target temperature information. In some embodiments, performing the baking process includes controlling the heating element uniformly.

An aspect of this description relates to a method. The method includes performing a baking process on a wafer, wherein the baking process comprises heating the wafer for a first duration using a heating element. The method further includes measuring a temperature of the heating element and a temperature of the wafer during the first duration to obtain temperature information related to both the heating element and the wafer. The method further includes increasing a duration of the baking process beyond the first duration in response to the temperature information. In some embodiments, the method further includes decreasing, during the first duration, an amount of heat provided by the heating element as a rate of change of the temperature information versus time increases. In some embodiments, performing the baking process includes individually controlling each of a plurality of heating zones the heating element. In some embodiments, performing the baking process includes controlling the heating element uniformly. In some embodiments, increasing the duration includes determining a magnitude of the duration based on a rate of heating for target temperature information. In some embodiments, increasing the duration includes transmitting signals to the heating element. In some embodiments, performing the baking process includes controlling a first heating zone of a plurality of heating zones of the heating element based on an amount of heat provided by a second heating zone of the plurality of heating zones. In some embodiments, controlling the first heating zone includes controlling the first heating zone based on the second heating zone adjacent to the first heating zone. In some embodiments, performing the baking process includes controlling an infrared light source or controlling flow of a heating fluid through the heating element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
performing a baking process on an entirety of water, wherein the baking process comprises heating the wafer for a first duration using a heating element;
measuring a temperature of the heating element and a temperature of the wafer during the first duration to obtain temperature information related to both the heating element and the wafer; and
decreasing, during the first duration, an amount of heat provided by the heating element as a rate of change of the temperature information versus time increases.

2. The method of claim 1, wherein performing the baking process comprises individually controlling each of a plurality of heating zones of the heating element.

3. The method of claim 1, wherein performing the baking process comprises controlling a resistive heater of the heating element.

4. The method of claim 1, wherein performing the baking process comprises controlling a fluid flowing through the heating element.

5. The method of claim 1, wherein performing the backing process comprises controlling an infrared light source.

6. The method of claim 1, further comprising increasing a duration of the baking process beyond the first duration in response to the temperature information being below a target temperature information.

7. The method of claim 6, wherein increasing the duration of the baking process comprises determining the duration based on a target heating rate of the target temperature information.

8. The method of claim 1, wherein performing the baking process comprises controlling the heating element uniformly.

9. A method comprising:
performing a baking process on an entirety of a water, wherein the baking process comprises heating the wafer for a first duration using a heating element;
measuring a temperature of the heating element and a temperature of the wafer during the first duration to obtain temperature information related to both the heating element and the wafer; and
increasing a duration of the baking process beyond the first duration in response to the temperature information.

10. The method of claim 9, further comprising decreasing, during the first duration, an amount of heat provided by the heating element as a rate of change of the temperature information versus time increases.

11. The method of claim 9, wherein performing the baking process comprises individually controlling each of a plurality of heating zones of the heating element.

12. The method of claim 9, wherein performing the baking process comprises controlling the heating element uniformly.

13. The method of claim 9, wherein increasing the duration comprises determining a magnitude of the duration based on a rate of heating for target temperature information.

14. The method of claim 9, wherein increasing the duration comprises transmitting signals to the heating element.

15. The method of claim 9, wherein performing the baking process comprises controlling a first heating zone of a plurality of heating zones of the heating element based on an amount of heat provided by a second heating zone of the plurality of heating zones.

16. The method of claim 15, wherein controlling the first heating zone comprises controlling the first heating zone based on the second heating zone adjacent to the first heating zone.

17. The method of claim 9, wherein performing the baking process comprises controlling an infrared light source or controlling flow of a heating fluid through the heating element.

18. A method comprising:
performing a baking process on an entirety of a wafer, wherein the baking process comprises heating the wafer for a first duration using a heating element, and the heating element comprises a plurality of heating zones;
measuring a temperature of at least one of the plurality of heating zones of the heating element and a temperature of the wafer during the first duration to obtain temperature information related to both the heating element and the wafer; and
at least one of:
increasing a duration of the baking process beyond the first duration in response to the temperature information; or
decreasing, during the first duration, an amount of heat provided by the at least one zone of the plurality of heating zones of the heating element as a rate of change of the temperature information versus time increases.

19. The method of claim 18, wherein performing the baking process comprises performing the baking process with at least a portion of the wafer in direct contact with the heating element.

20. The method of claim 18, further comprising individually controlling each of the plurality of heating zones during the baking process.

* * * * *